(12) United States Patent
Takinami et al.

(10) Patent No.: US 7,808,323 B2
(45) Date of Patent: Oct. 5, 2010

(54) HIGH-EFFICIENCY ENVELOPE TRACKING SYSTEMS AND METHODS FOR RADIO FREQUENCY POWER AMPLIFIERS

(75) Inventors: Koji Takinami, Saratoga, CA (US); Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 364 days.

(21) Appl. No.: 12/126,475

(22) Filed: May 23, 2008

(65) Prior Publication Data
US 2009/0289720 A1 Nov. 26, 2009

(51) Int. Cl.
*H03F 3/04* (2006.01)
(52) U.S. Cl. .................................. 330/297; 330/296
(58) Field of Classification Search .............. 330/297, 330/285, 296
See application file for complete search history.

(56) References Cited

U.S. PATENT DOCUMENTS 7,449,954 B2 * 11/2008 Bocock et al. ............... 330/285
7,679,433 B1 * 3/2010 Li ............................... 330/10
7,755,422 B2 * 7/2010 Schell et al. ................. 330/10
2008/0074207 A1 3/2008 McCune et al.

OTHER PUBLICATIONS

U.S. Appl. No. 12/022,141, Koji Takinami et al.
F. Wang, "An Improved Power-Added Efficiency 19-dBm Hybrid Envelope . . . ," IEEE Transactions on Microwave Theory and Techniques, Dec. 2006, pp. 4086-4099, vol. 54, No. 12.

* cited by examiner

*Primary Examiner*—Henry K Choe (57) ABSTRACT

High-efficiency envelope tracking (ET) methods and apparatus for dynamically controlling power supplied to radio frequency power amplifiers (RFPAs). An exemplary ET circuit includes a switch-mode converter coupled in parallel with a split-path linear regulator. The switch-mode converter is configured to generally track an input envelope signal Venv and supply the current needs of a load (e.g., an RFPA). The split-path linear regulator compensates for inaccurate envelope tracking by sourcing or sinking current to the load via a main current path. A current sense path connected in parallel with the main current path includes a current sense resistor used by a hysteresis comparator to control the switching of the switch-mode converter. The split-path linear regulator is configured so that current flowing in the current sense path is a lower, scaled version of the current flowing in the main current path.

14 Claims, 6 Drawing Sheets

HIGH-EFFICIENCY ENVELOPE TRACKING SYSTEMS AND METHODS FOR RADIO FREQUENCY POWER AMPLIFIERS

FIELD OF THE INVENTION

The present invention relates generally to controlling the delivery of power to radio frequency power amplifiers (RFPAs). More specifically, the present invention relates to high-efficiency envelope tracking (ET) systems and methods for controlling and supplying power to RFPAs.

BACKGROUND OF THE INVENTION

In an effort to satisfy consumer demand for faster data rates, while at the same time striving to use the radio frequency spectrum most efficiently, many modern wireless communications technologies employ non-constant-envelope modulation formats. For example, 802.11g (or "Wi-Fi") wireless local area network (WLAN) technology employs orthogonal frequency-division multiplexing (OFDM), which is non-constant envelope modulation format. Third generation (3G) wideband code division multiple access (W-CDMA) cellular technology employs quadrature phase shift keying (QPSK), which is also a non-constant envelope modulation format. Other and future technologies, such as the fourth generation (4G) Long Term Evolution (LTE) cellular communications technology, also use and contemplate the use of non-constant-envelope modulation formats.

Non-constant-envelope modulation formats typically result in signals having a high peak-to-average (PAR) ratio. To avoid distortion of these signals as they are amplified for transmission, the radio frequency power amplifier (RFPA) of a traditional transmitter (e.g., a quadrature-modulator-based transmitter) must be implemented as a linear RFPA. However, because linear RFPAs are not very power efficient, the requirement of a linear RFPA results in a sacrifice of efficiency for linearity. This efficiency versus linearity trade-off is highly undesirable, particularly when the transmitter is employed in battery-powered applications such as in a wireless handset or a wireless network interface card of portable computer.

Figure 1:
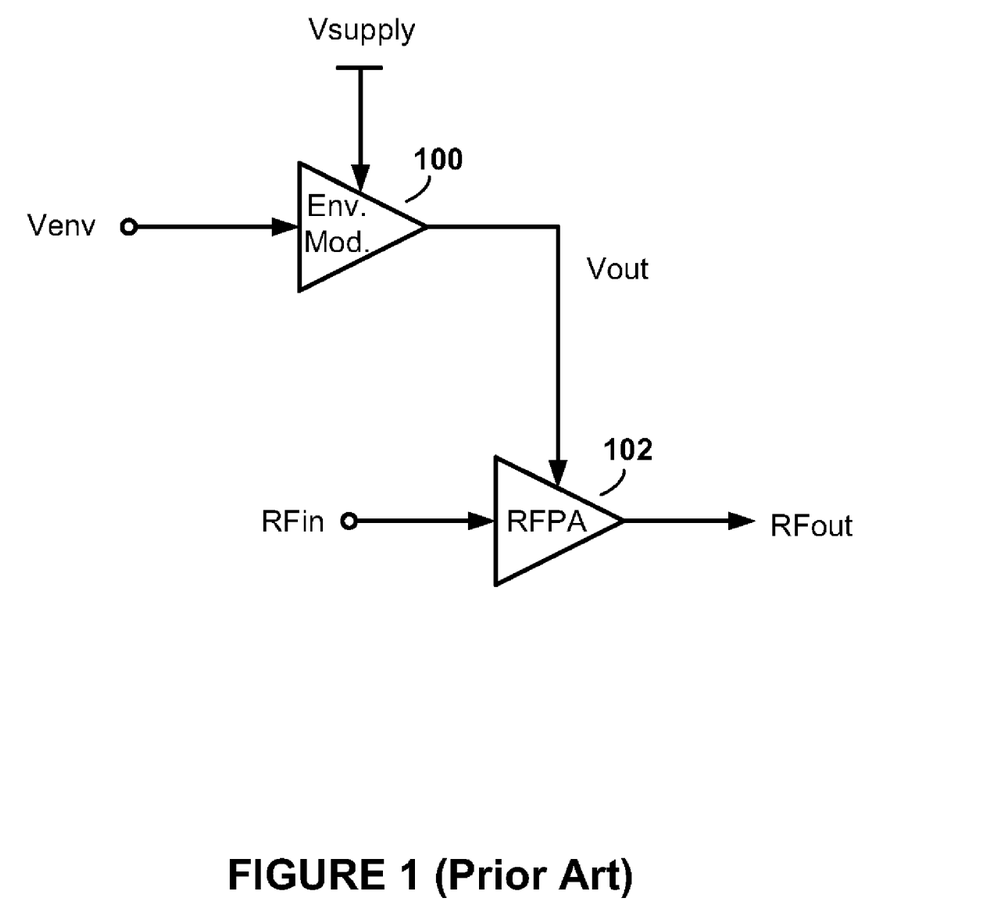
FIG. 1 is a simplified drawing of a conventional envelope tracking (ET) system.

Not only are linear RFPAs inefficient, they are also usually the dominant consumer of power in a transmitter. For this reason, substantial efforts have been made to improve the efficiencies of RFPAs. One proven and commonly used approach is to employ an envelope modulator to dynamically control the power supplied to the RFPA. This "dynamic power control" approach is illustrated in FIG. 1. An envelope modulator 100 operates to modulate a direct current (DC) supply voltage Vsupply according to amplitude variations in an input envelope signal Venv to produce a dynamic power supply signal Vout, which is used to power the RFPA 102. By controlling the power supplied to the RFPA 102 so that it dynamically tracks the input envelope signal Venv, the efficiency of the RFPA 102 is improved.

In general, dynamic power control can be applied in either an envelope tracking (ET) system or an envelope elimination and restoration (EER) system. Operation of the EER system is similar to operation of the ET system, except that in the EER system the envelope information is removed before the signal is introduced to the RF input RFin of the RFPA 102. Removing the envelope information prior to amplification obviates the need to employ a linear RFPA, thereby circumventing the linearity versus efficiency trade-off that plagues more conventional communications transmitters. The RFPA 102 in the EER system is typically implemented as a Class D, E or F switch-mode type of RFPA. When configured in this manner, the previously-removed envelope information is restored at the output of the RFPA 102 by modulating the drain (or collector) of the RFPA 102 with the dynamic power supply signal Vout as the switch-mode RFPA 102 amplifies the constant-envelope signal.

Figure 2:
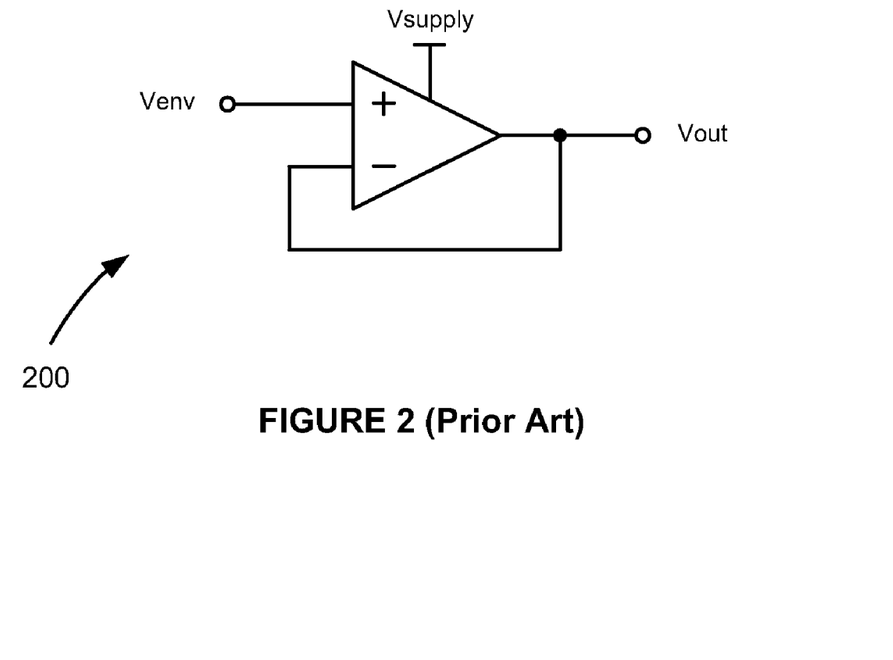
FIG. 2 is simplified diagram of a conventional linear regulator.

The envelope modulator 100 in FIG. 1 can be implemented in various ways. One approach is to use a linear regulator, which can be implemented using an operational amplifier, as shown in FIG. 2. When configured as an envelope modulator, the linear regulator 200 provides a dynamic power supply signal Vout (i.e., an envelope modulated power supply signal Vout) that linearly tracks the amplitude variations of the input envelope signal Venv.

In addition to its linear response, one attractive property of the linear regulator 200 is that it can react quickly to sudden changes in the input envelope signal Venv. Consequently, when used to implement the envelope modulator 100 in FIG. 1, the RFPA 102 is able to operate over a wide dynamic range of output power. However, a significant drawback of the linear regulator 200 is that it is inefficient for input signal amplitudes that are lower than the magnitude of the DC supply voltage Vsupply. This inefficiency increases as the voltage difference between the input signal and DC supply voltage Vsupply widens.

Figure 3:
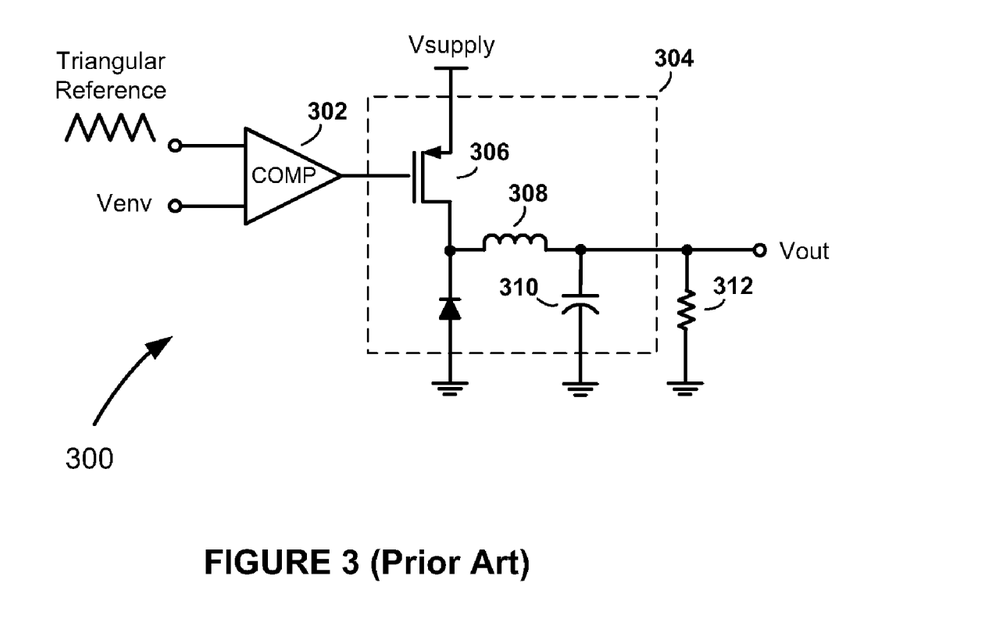
FIG. 3 is a diagram of a conventional switch-mode converter.

A more efficient alternative to implementing the envelope modulator 100 is a power conversion device known as a switch-mode converter. FIG. 3 is a simplified drawing of a typical switch-mode converter 300. The switch mode converter 300 includes a comparator 302 and a buck converter 304. The buck converter 304 includes a transistor 306 configured to operate as a switch, an inductor 308, and a capacitor 310. The comparator 302 is configured to operate as a pulse-width modulator, generating a pulse-width modulated (PWM) signal having pulse-widths that vary depending on the amplitude of the input envelope signal Venv compared to the amplitude of a triangular reference signal. The PWM signal is coupled to the gate of the transistor 306, so that the transistor 306 turns on and off, alternately coupling and decoupling the inductor 308 to and from the DC supply voltage Vsupply. The inductor 308 and capacitor 310 operate as a low-pass filter, which filters the inductor current before it is transferred to the load 312. The resulting output voltage is an envelope modulated power supply signal Vout which tracks the amplitude variations of the input envelope signal Venv.

Although the switch-mode converter 300 in FIG. 3 is more efficient than the linear regulator 200, it has a couple of well-known drawbacks. First, the switching action of the transistor 306 generates switching noise, some of which is introduced to the RFPA supply input despite the presence of the inductor 308/capacitor 310 low-pass filter. This switching noise can make it difficult to comply with noise limitation requirements imposed by communications standards. Second, the switch-mode converter 300 is not operable over wide bandwidths. This is attributable to the large gate capacitance of the transistor 306 (typically 10-30 pF on an integrated circuit), which limits the switching speed of the switching transistor 306 to only about 5 MHz or so. Accurate envelope tracking requires a switching frequency of twenty to fifty times higher than the required signal envelope bandwidth. However, because the signal envelope bandwidth of wide bandwidth applications is often 1 MHz or higher, switch-mode converters are not well-suited for generating dynamic power supply signals in wideband applications.

Figure 4:
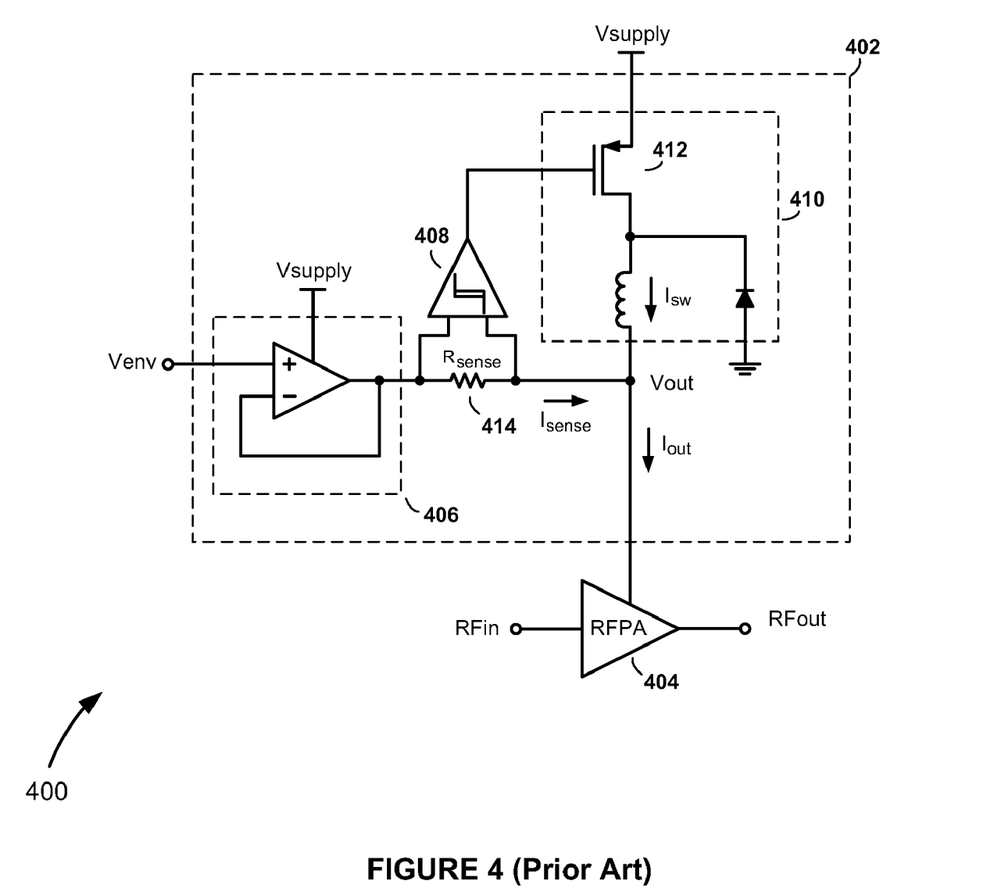
FIG. 4 is a diagram of a known ET system having an envelope modulator, which may be used to implement the envelope modulator of the ET system in FIG. 1.

Given the need for an envelope modulator that is both efficient and capable of operating over a wide bandwidth, various techniques have been proposed to exploit the most desirable properties of the linear regulator 200 and switch-mode converter 300 while at the same time avoiding their drawbacks. FIG. 4 is a drawing of an ET system 400 of one such approach. The ET system 400 comprises an envelope modulator 402 and an RFPA 404. The envelope modulator 402 includes a linear regulator 406 (similar to the linear regulator 200 shown and described above in connection with FIG. 2), a hysteresis comparator 408, and a switch-mode converter 410 (similar to the buck converter 304 of the switch-mode converter 300 shown and described above in connection with FIG. 3).

The switch-mode converter 410 operates to generally track the envelope of the input envelope signal Venv. The linear regulator 406 engages to compensate for the switch-mode converter's inability to track high-frequency content in the input envelope signal Venv, and to filter out switching noise generated in the switch-mode converter 410 by use of a feedback mechanism. The hysteresis comparator 408 reacts to voltage drops across the current sense resistor 414 that exceed predetermined upper and lower hysteresis voltage thresholds, by turning a switching transistor 412 of the switch-mode converter 410 on or off in manner that satisfies the current demand of the RFPA 404. The hysteresis voltage thresholds of the hysteresis comparator 408 are determined based on the desired combination of average switching frequency and signal fidelity.

To optimize the efficiency of the envelope modulator 402, the resistance of the current sense resistor 414 must be made small compared to the load resistance (i.e., the resistance of the RFPA 404 presented to the output of the envelope modulator 402). A small resistance is also required to avoid distorting the envelope modulator output voltage Vout caused by the output amplifier of the linear regulator 406 saturating. Absent a small resistance, distortion can only be avoided by limiting the maximum allowable amplitude of envelope modulator output voltage Vout. However, this results in degraded efficiency. So, for all these reasons, the resistance of the current sense resistor 414 must be small.

The envelope modulator 402 is usually formed in an integrated circuit (IC). A typical RFPA 404 presents a load of about five ohms. Accordingly, to optimize efficiency of the envelope modulator 402 and avoid exceeding the operational range of the linear regulator output amplifier, the resistance of the current sense resistor 414 on the IC must be on the order of only an ohm or less. Unfortunately, a resistance of this value, which is both accurate and reproducible, is very difficult to realize using standard semiconductor fabrication processes.

BRIEF SUMMARY OF THE INVENTION

High-efficiency envelope tracking (ET) methods and apparatus for dynamically controlling power supplied to radio frequency power amplifiers (RFPAs) are disclosed. An exemplary ET circuit includes a switch-mode converter coupled in parallel with a split-path linear regulator. The switch-mode converter is configured to generally track an input envelope signal Venv and supply the current needs of a load (e.g., an RFPA). The split-path linear regulator compensates for inaccurate envelope tracking by sourcing or sinking current to the load via a main current path.

A current sense path connected in parallel with the main current path includes a current sense resistor used by a hysteresis comparator to control the switching of the switch-mode converter. The split-path linear regulator is configured so that current flowing in the current sense path is a lower, scaled version of the current flowing in the main current path.

By permitting only the lower, scaled version to flow through the sense resistor, the current sense resistor can be made larger than is required in prior art approaches, and without a distortion or reduction in efficiency penalty.

Further features and advantages of the present invention, as well as the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 5:
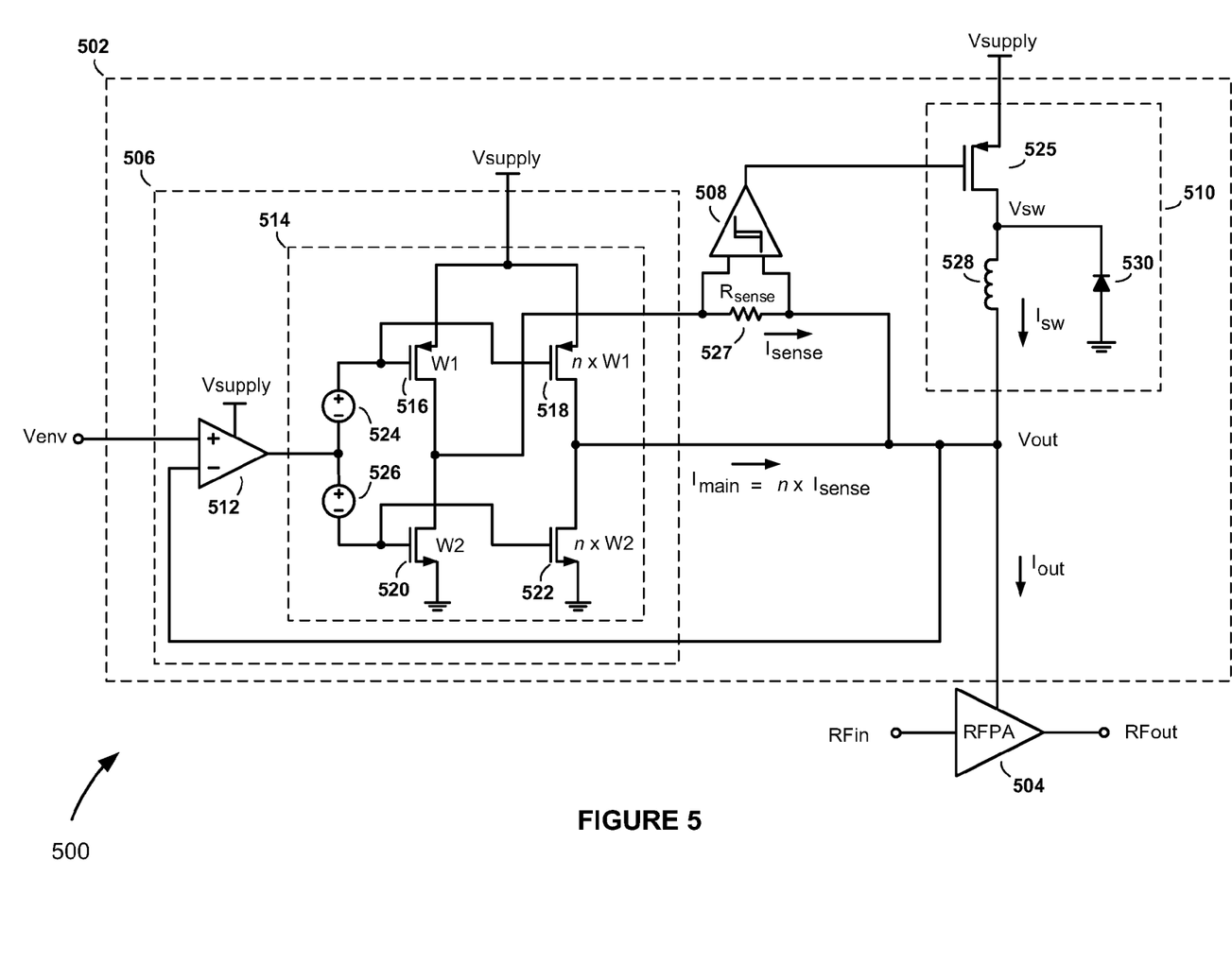
FIG. 5 is a drawing of an exemplary ET system, according to an embodiment of the present invention.

Referring to FIG. 5, there is shown an envelope tracking (ET) system 500, according to an embodiment of the present invention. The ET system 500 comprises an envelope modulator 502 and a radio frequency power amplifier (RFPA) 504. The RFPA 504 includes an RF input configured to receive an RF input signal RFin, an RF output configured to provide an RF output signal RFout, and a power supply input configured to receive a dynamically controlled power supply voltage Vout from an output node of the envelope modulator 502.

The dynamic power control methods and apparatus of the present invention can be used in envelope elimination and restoration (EER) type systems employing nonlinear RFPAs, such as a polar transmitter, as well as in ET type systems employing linear RFPAs. Because the envelope of the input signal envelope is tracked in both EER and ET approaches, the term "envelope tracking" (including its abbreviated form "ET") is used herein in its most general sense to refer to both ET and EER types of systems.

The envelope modulator 502 includes a split-path linear regulator 506, a hysteresis comparator 508, and a switch-mode converter 510. The split-path linear regulator 506 includes an operational amplifier (op-amp) input stage 512 and a split-path linear output stage 514. The op-amp input stage 512 has a noninverting input configured to receive an envelope signal Venv and an inverting input coupled to an output node of the envelope modulator 502. The output of the op-amp input stage 512 is coupled to an input of the split-path linear output stage 514. In addition to compensating for envelope tracking inaccuracies of the switch-mode converter 510, the split-path linear regulator 506 operates to minimize switching noise generated by the switch-mode converter 510, via a feedback path formed between an output of the envelope modulator 502 to the inverting input of the op-amp input stage 512.

The split-path linear output stage 514 comprises a push-pull type of amplifier (e.g., a Class A, B, AB, or C linear amplifier) having first and second p-channel metal-oxide-semiconductor field effect (PMOS) transistors 516 and 518 and first and second n-channel MOS (NMOS) transistor 520 and 522. The gates of the first and second PMOS transistors 516 and 518 are connected to each other, and the gates of the first and second NMOS transistors 520 and 522 are also connected to each other. The sources of the first and second PMOS transistors 516 and 518 are coupled to a direct current (DC) power supply voltage Vsupply, and the sources of the first and second NMOS transistors 520 and 522 are coupled to ground. The drains of the first and second PMOS transistors 516 and 518 are coupled to the drains of the first and second NMOS transistors 520 and 522, respectively. A first biasing voltage 524 is coupled to the gates of the first and second PMOS transistors 516 and 518. A second biasing voltage 526 is coupled to the gates of the first and second NMOS transistor 520 and 522. The first and second biasing voltages 524 and 526 are used to set the operating point of the split-path linear output stage 514. They can also be adjusted to account for the difference in threshold voltages of the PMOS and NMOS transistors.

According to one embodiment, the first and second PMOS transistors 516 and 518 have the same nominal threshold voltage and gate length, and the first and second NMOS transistors 520 and 522 have the same nominal threshold voltage and gate length. The gate width of the second PMOS transistor 518 (or emitter area if bipolar junction transistors are used) and the gate width of the second NMOS transistor 522 are both scaled so that they are n times wider than the gate width W1 of the first PMOS transistor 516 and gate width W2 of the first NMOS transistor and 520, respectively, where n is an integer or non-integer real number greater than one.

A first output node of the split-path linear output stage 514 is coupled to a main current path. A second output node of the split-path linear output stage 514 is coupled to a current sense path having a current sense resistor 527 with terminals coupled to the input terminals of the hysteresis comparator 508. The main current path and the current sense path form parallel current paths that terminate at the output node of the envelope modulator 502. As explained in more detail below, the first and second output nodes of the split-path linear output stage 514 source and sink current to and from the output node of the envelope modulator 502 via the current sense and main current paths depending on the current demands of the RFPA 504 and in a manner that causes the output voltage of the envelope modulator 502 to track the envelope of the input envelope signal Venv.

The drain-source on resistances of the second PMOS transistor 518 and the second NMOS transistor 522 are made so that they are low compared to the resistance of the current sense resistor 527. The drain-source on resistances of the first PMOS transistor 516 and the first NMOS transistor 520 are determined based on the hysteresis thresholds −Vth (lower hysteresis threshold voltage) and +Vth (upper hysteresis threshold voltage) of the hysteresis comparator 508, the voltage of the DC power supply voltage Vsupply, and the resistance of the current sense resistor 527. According to one embodiment, the lower and upper hysteresis thresholds −Vth and +Vth have values within the ranges −10 to −5 mV and +5 to +10 mV, respectively, the DC power supply voltage Vsupply is within the range of 2 to 5 V, and the resistance of the current sense resistor 527 is selected to have a value between 1-10Ω. With these values, the on resistances of the first PMOS transistor 516 and first NMOS transistor 520 can be selected to be within the kΩ or MΩ range.

The switch-mode converter 510 includes a PMOS transistor 525 configured to operate as a switch, an inductor 528 and a diode 530. The gate of the PMOS transistor 525 is coupled to the output of the hysteresis comparator 508. The source is coupled to the DC power supply voltage Vsupply. The drain is coupled to a first terminal of the inductor 528 and to the cathode of the diode 530. A second terminal of the inductor 528 is coupled to the output node of the envelope modulator 502. The anode of the diode 530 is coupled to ground.

Figure 6A:
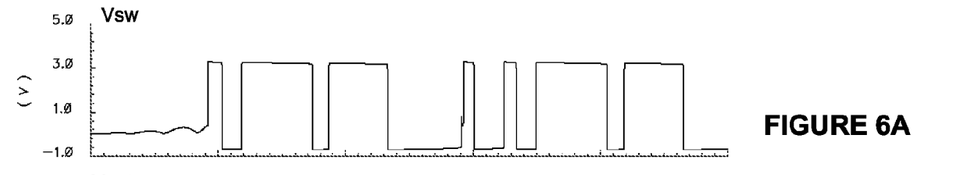
FIGS. 6A-C are voltage waveforms of the input signal envelope Venv, envelope modulated power supply signal Vout, and switch-mode converter voltage Vsw applied and obtained in a simulated operation of the ET system in FIG. 5.
Figure 6B:
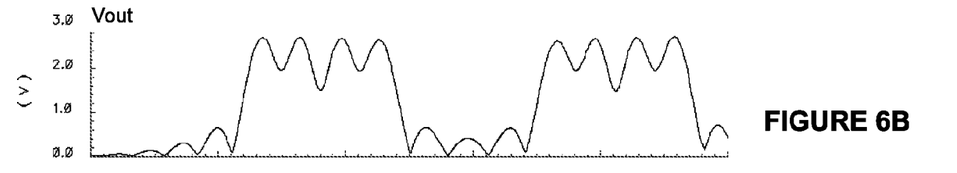
Figure 6C:
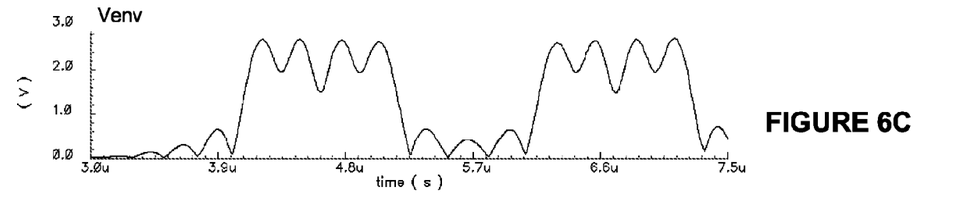

Together the PMOS transistor 525 and the diode 530 form a single-pole-double-throw switch. During operation, the hysteresis comparator 508 functions to turn the switch on and off so that the switching voltage Vsw at a switching node of the switch-mode converter 510 generally tracks the envelope of the input envelope signal Venv, as illustrated in FIG. 6A. The split-path linear regulator 506 operates to compensate for inaccuracies in the envelope tracking, so that output voltage Vout of the envelope modulator more accurately tracks the envelope of the input envelope signal Venv, as illustrated in FIGS. 6B and C.

In compensating for envelope tracking inaccuracies of the switch-mode converter 510, the split-path linear regulator 506 functions to sink excess current generated by the switch-mode converter 510 that is not needed by the RFPA 504, and to source current (i.e., supplement the current supplied by the switch-mode converter 510) when the current demand of the RFPA 504 exceeds an average current being supplied by the switch-mode converter 510. When sinking current, the first and second PMOS transistors 516 and 518 are off and the first and second NMOS transistors 520 and 522 are on. Because the gates of the first and second NMOS transistors 520 and 522 are tied together, and because the gate width of the second NMOS transistor 522 is n times wider than the gate width W2 of the first NMOS transistor 520, the current passing through the sense resistor 527 (Isense) is a factor of n times lower than the current being sunk through the main current path (Imain). When sourcing current, the first and second PMOS transistors 516 and 518 are on and the first and second NMOS transistors 520 and 522 are off. Similar to the first and second NMOS transistor 520 and 522, the gates of the first and second PMOS transistors 516 and 518 are tied together and the gate width of the second PMOS transistor 518 is n times wider than the gate width W1 of the first PMOS transistor 516. Consequently, whether sourcing or sinking current, the current Isense flowing through the current sense resistor 527 in the current sense path is a factor of n times lower than the current Imain flowing in the low-impedance, main current path.

Figure 7A:
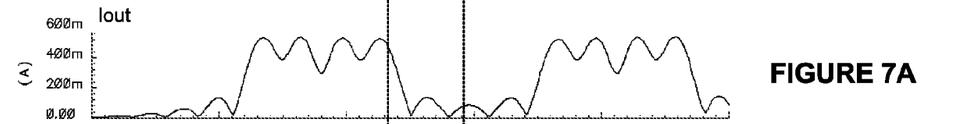
FIGS. 7A-D are current waveforms of the envelope modulator output current Iout, switch-mode converter output current Isw, main current path current Imain, and sense path current Isense, obtained from a simulated operation of the ET system in FIG. 5.
Figure 7B:
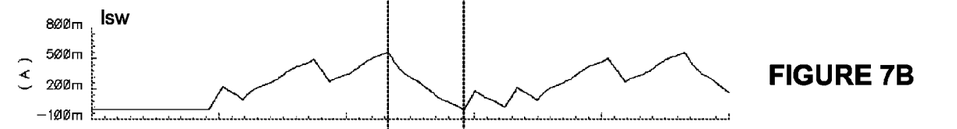
Figure 7C:
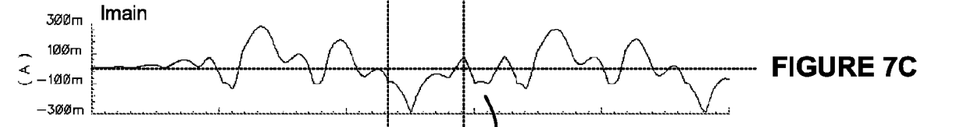
Figure 7D:
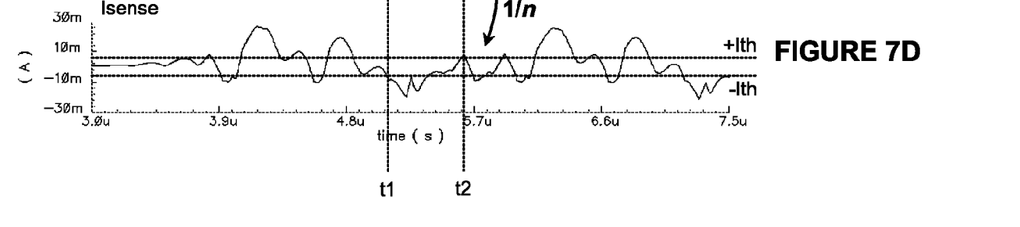

As the sense current Isense passes through the current sense resistor 527, a voltage is dropped across the current sense resistor 527. The hysteresis comparator 508 compares the polarity and magnitude of the voltage drop to its upper and lower hysteresis thresholds +Vth and −Vth in determining whether to turn the PMOS transistor 525 of the switch-mode converter 510 on or off. When the split-path linear regulator 506 is sinking current (Isense negative), and the absolute value of the current Isense being sunk increases to a value large enough to cause the voltage drop across the current sense resistor 527 to drop below the lower hysteresis voltage threshold −Vth, the hysteresis comparator 508 switches state and causes the PMOS transistor 525 of the switch-mode converter 510 to temporarily turn off. Examples of this type of event are shown in the current waveform diagrams in FIGS. 7A-D. For example, immediately after time t1 the absolute value of the current being sunk by the split-path linear regulator 506 in the current sense path becomes great enough to cause the voltage drop across the current sense resistor 527 to drop below the lower hysteresis threshold (represented as a lower current threshold –Ith=–Vth/Rsense in FIG. 7D) of the hysteresis comparator 508. The hysteresis comparator 508 responds by turning the PMOS transistor 525 off. When turned off, the switch-mode converter current Isw is supplied by energy previously stored in the inductor 528, rather than from the DC power supply voltage Vsupply. The switch-mode converter current Isw decreases linearly as the energy in the inductor 528 is released, as can be seen between times t1 and t2 in FIG. 7B.

As the switch-mode converter 510 current Isw decreases, it eventually becomes insufficient to meet the current demand of the RFPA 504 and the split-path linear regulator 506 begins to source current to the RFPA 504 to compensate. As the split-path linear regulator 506 begins to source current, the direction of the sense current Isense changes from negative to positive. When the magnitude of the sense current Isense increases to a value high enough to cause the voltage drop across the current sense resistor 527 to exceed the upper hysteresis threshold +Vth (represented as an upper current threshold +Ith=+Vth/Rsense in FIG. 7D) at time t2, the hysteresis comparator 508 changes state and turns the PMOS transistor 525 on again. The PMOS transistor 525 then remains on until the sense current Isense once again reverses and decreases to a value sufficient to cause the voltage drop across the current sense resistor 527 to drop below the lower hysteresis threshold –Vth. By sourcing and sinking current to and from the output node of the envelope modulator 502 in this manner, the current demand of the RFPA 504 is satisfied while the output voltage Vout of the envelope modulator 502 accurately tracks the envelope of the input envelope signal Venv.

The ET systems and methods of the present invention offer a number of benefits and advantages. The substantial reduction in the current Isense flowing through the current sense resistor Rsense affords the ability to increase the resistance of the current sense resistor Rsense without compromising the efficiency or output power range capability of the envelope modulator 502. Increasing the resistance of the current sense resistor Rsense is beneficial since the envelope modulator 502 is, in most cases, formed in an integrated circuit (IC), yet forming small resistances that are accurate, reproducible from wafer-to-wafer, and controllable across the surface of an individual wafers are difficult to manufacture using standard semiconductor fabrication processes. Another benefit is that voltage variations at the power supply input of the RFPA 504 caused by voltage drops across the current sense resistor are reduced compared to the approach in FIG. 4.

Figure 8:
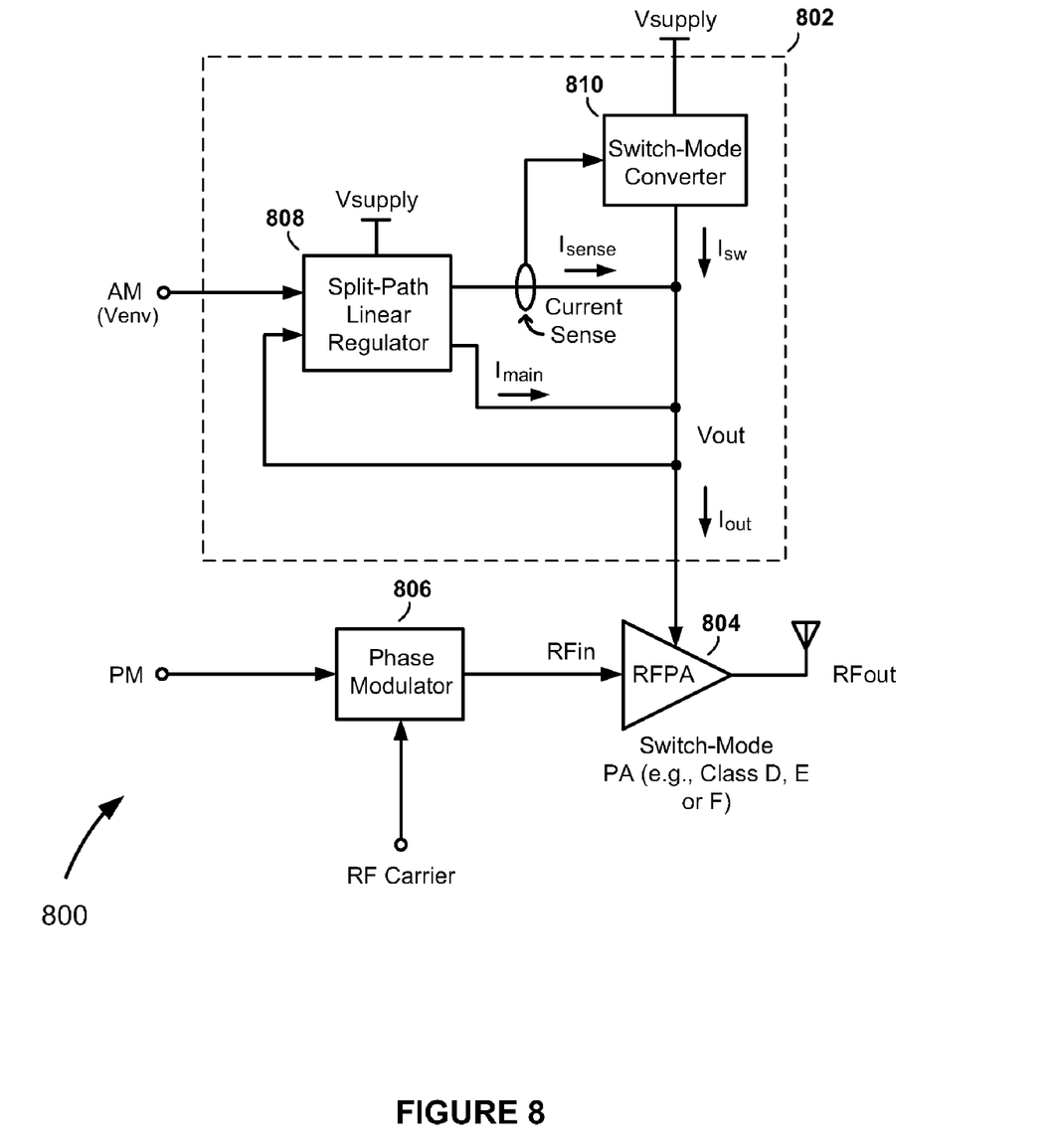
FIG. 8 is a drawing of a polar transmitter that is adapted to include an envelope modulator similar to the envelope modulator of the ET system in FIG. 5, according to an embodiment of the present invention.

The ET systems and methods of the present invention may be used in a wide variety of envelope tracking applications in which either or both high efficiency and wide bandwidth operation is/are desirable. FIG. 8 illustrates, for example, how an envelope modulator 802 similar to the envelope modulator 502 shown and described in FIG. 5 may be used in a polar transmitter 800, according to an embodiment of the present invention. The polar transmitter 800 comprises an RFPA 804 having an RF input configured to receive a constant-amplitude phase modulated RF signal RFin from a phase modulator 806 in a phase modulation (PM) path, and a power supply input configured to receive an envelope modulated power supply signal Vout from the envelope modulator 802 configured within an amplitude modulation (AM) path.

The envelope modulator 802 includes a split-path linear regulator 808 coupled in parallel with a switch-mode converter 810. The split-path linear regulator 808, similar to the split-path linear regulator 506 of the envelope modulator 502 in FIG. 5, includes a split-path linear output stage. A first output of the split-path linear output stage is coupled to a current sense path, and a second output is coupled to a main path.

The phase modulator 806 is operable to modulate an RF carrier signal according to a PM signal received from a baseband system (not shown), to generate the phase modulated RF signal RFin. The envelope modulator 802 is operable to generate an envelope modulated power supply signal Vout having an envelope that tracks the envelope of the envelope modulation signal Venv in a manner similar to the envelope modulator 502 shown and described above in FIG. 5. The envelope modulated power supply signal Vout is coupled to the power supply input of the RFPA 804 while the phase modulated RF signal RFin is applied to the RF input of the RFPA 804. The RFPA 804 is configured to operate as a switch-mode PA (e.g. a Class-D, E or F switch-mode PA) in compression. Accordingly, the output power of the resulting phase and envelope modulated RF signal at the output of the RFPA 804 is directly and dynamically controlled by the envelope modulated power supply signal Vout generated by the envelope modulator 802.

The present invention has been described with reference to specific exemplary embodiments. These exemplary embodiments are merely illustrative, and not meant to restrict the scope or applicability of the present invention in any way. For example, the ET systems and methods of the present invention may be used to control the delivery of power to either linear or nonlinear RFPAs. In particular, they may be used to control the delivery of power to an RFPA configured to amplify constant envelope signals (e.g., as in an envelope elimination and restoration (ERR) type of transmitter, such as a polar transmitter, for example), or to an RFPA configured to amplify non-constant-envelope signals. Further, while the ET systems and methods of the present invention are well-suited for use in RF cellular communications applications, they may also be advantageously used in any other application in which the high efficiency and wideband capabilities of the systems and methods of the invention may be advantageously exploited. For example, they can be used to control the delivery of power in 802.11a or 802.11g Wi-Fi wireless communications applications and video applications. Still further, the ET systems and methods of the present invention may be employed in microwave frequency applications, and the term "radio frequency" (including its abbreviated form "RF") is used herein to refer to all radio frequencies in the electromagnetic spectrum, including those radio frequencies that are often referred to in the art as "microwave" frequencies. For at least the foregoing reasons the inventions should not be construed as being limited to any of the specific exemplary embodiment or any particular application. Finally, various modifications or changes to the specific exemplary embodiments will be naturally suggested to those of ordinary skill in the art. Those modifications or changes should also be included, therefore, within the spirit and purview of the appended claims.

What is claimed is:
1. An envelope tracking (ET) circuit, comprising
a switch-mode converter having a switch control input, a power supply input configured to be coupled to a direct current (DC) power supply, and an output node;

a split-path linear regulator having an envelope signal input configured to receive an envelope signal, a power supply input configured to be coupled to said DC power supply, a first output node and a second output node;

a current sense path configured between the first output node of said split-path linear regulator and the output node of said switch-mode converter; and a main current path configured between the second output node of said split-path linear regulator and the output node of said switch-mode converter.

2. The ET circuit of claim 1, further comprising a controller configured to control switching of said switch-mode converter depending on a signal property of a signal sensed in said current sense path.

3. The ET circuit of claim 2 wherein said controller comprises a hysteresis comparator configured to control switching of said switch-mode converter depending on a polarity of a voltage dropped across a current sense resistor configured within said current sense path.

4. The ET circuit of claim 1 wherein said split-path linear regulator includes a low-current path that selectively couples the first output node to the DC supply or ground and a high-current path that selectively couples the second output node to the DC supply or ground.

5. The ET circuit of claim 4 wherein said low-current path includes one or more transistors having a gate width that is a fraction of a gate width of one or more transistors included within said high-current path.

6. The ET circuit of claim 1, further comprising a feedback path configured between the output node of said switch-mode converter and an input of said split-path linear regulator.

7. A method of dynamically controlling power supplied to a load, comprising:

receiving an input envelope signal;

supplying a switch-mode current to a load so that a voltage supplied to the load generally tracks amplitude variations of said input envelope signal;

in a current sense path, sensing when an instantaneous current required of the load is less than or greater than the switch-mode current being supplied to the load; and in a main current path separate from said current sense path, supplementing the switch-mode current with a linear regulator current when the instantaneous current required of the load is greater than the switch-mode current being supplied to the load and sinking excess switch-mode current when the instantaneous current required of the load is less than the switch-mode current being supplied to the load, so that the voltage supplied to the load accurately tracks the amplitude variations of said input envelope signal.

8. The method of claim 7, further comprising comparing the voltage supplied to the load to an amplitude of the input envelope signal in determining whether to supplement the switch-mode current or sink excess switch-mode current.

9. The method of claim 7, further comprising:

in the current sense path, sensing when the excess current being sunk falls below a first predetermined threshold; and in the main current path, reducing the supply of switch-mode current when the excess current falls below the first predetermined threshold.

10. The method of claim 9, further comprising:

in the current sense path, sensing when the linear regulator current supplementing the switch-mode current exceeds a second predetermined threshold; and in the main current path, increasing the supply of switch-mode current when the linear regulator current exceeds the second predetermined threshold.

11. A circuit for dynamically controlling the power supplied to a load, comprising:

means for generating a supply voltage that generally tracks an envelope of an input envelope signal;

means for detecting when said supply voltage does not accurately track said envelope; and means for compensating for inaccuracies in tracking the envelope of the input envelope signal, wherein said means for detecting is configured to sense a current that is a scaled version of a current being sourced or sunk to the load as said means for compensating is compensating for inaccuracies in tracking the envelope of the input envelope signal.

12. The circuit of claim 11 wherein said means for compensating includes means for comparing the supply voltage to the input envelope signal.

13. The circuit of claim 11, further comprising means for controlling said means for generating operable to cause said means for generating to reduce a current it supplies to the load when said means for detecting senses that a scaled version of a current being sunk by said means for compensating falls below a first predetermined threshold.

14. The circuit of claim 13 wherein said means for controlling is further operable to cause said means for generating to increase the current it supplies to the load when said means for detecting senses that a scaled version of a current being sourced by said means for compensating rises above a second predetermined threshold.

* * * * *